United States Patent [19]

Jansen et al.

[11] Patent Number: 5,253,263

[45] Date of Patent: Oct. 12, 1993

[54] HIGH-POWER SURFACE-EMITTING SEMICONDUCTOR INJECTION LASER WITH ETCHED INTERNAL 45 DEGREE AND 90 DEGREE MICROMIRRORS

[75] Inventors: Michael Jansen; Jane J. Yang, both of Los Angeles; Szutsun S. Ou, Manhattan Beach; Thomas J. Roth, Redondo Beach, all of Calif.

[73] Assignee: TRW Inc., Redondo Beach, Calif.

[21] Appl. No.: 850,083

[22] Filed: Mar. 12, 1992

[51] Int. Cl.$^5$ .............................................. H01S 3/19
[52] U.S. Cl. ..................................... 372/45; 372/50; 372/108; 372/49
[58] Field of Search ....................... 372/45, 50, 108, 44, 372/48, 49

[56] References Cited

U.S. PATENT DOCUMENTS

| | | | |
|---|---|---|---|
| 4,633,476 | 12/1986 | Scifres et al. | 372/45 |
| 4,665,527 | 5/1987 | Akiba et al. | 372/96 |
| 4,760,578 | 7/1988 | Oshima et al. | 372/45 |
| 4,819,243 | 4/1989 | Opschoor | 372/45 |
| 4,881,236 | 11/1989 | Brueck et al. | 372/45 |
| 4,894,840 | 1/1990 | Liau et al. | 372/108 |
| 4,901,327 | 2/1990 | Bradley | 372/45 |
| 5,038,356 | 8/1991 | Butez et al. | 372/45 |
| 5,159,603 | 10/1992 | Kim | 372/45 |

FOREIGN PATENT DOCUMENTS

| | | | |
|---|---|---|---|
| 0198790 | 10/1985 | Japan | 372/45 |
| 0248283 | 10/1987 | Japan | 372/45 |

Primary Examiner—Georgia Y. Epps
Attorney, Agent, or Firm—James M. Steinberger; Sol L. Goldstein

[57] ABSTRACT

A surface-emitting semiconductor injection laser for use in fabricating high-power two-dimensional monolithic laser arrays. The surface-emitting semiconductor laser includes a substrate and an active layer and a pair of cladding layers formed on the substrate. A folded resonator cavity is formed by highly-reflective 45° and 90° micromirrors that are etched at either end of the active layer and by a partially-reflective reflector that is positioned between the 45° micromirror and the substrate for outcoupling the laser light from the resonator cavity. The semiconductor laser is mounted junction down on a heat sink to position the active layer close to the heat sink for good heat dissipation at high power levels. In one preferred embodiment of the present invention, the substrate is optically opaque and an opening is etched in the substrate for outcoupling the laser light. In another preferred embodiment of the invention, the substrate is optically transparent and a microlens is formed on the substrate to collimate the laser light.

16 Claims, 1 Drawing Sheet

HIGH-POWER SURFACE-EMITTING SEMICONDUCTOR INJECTION LASER WITH ETCHED INTERNAL 45 DEGREE AND 90 DEGREE MICROMIRRORS

BACKGROUND OF THE INVENTION

This invention relates generally to semiconductor injection lasers and, more particularly, to high-power surface-emitting semiconductor injection lasers.

High-power laser light sources are required for a variety of optical systems, such as optoelectronic logic circuits, fiber optic communication systems, and for optically pumping solid state lasers. Semiconductor injection lasers are particularly well suited as laser light sources for these optical systems because of their small size, reliability, and operation at wavelengths having low transmission and dispersion losses in glass fiber optics.

A semiconductor injection laser is a diode device in which a forward bias voltage is applied across an active layer formed between n-doped and p-doped cladding layers. Excess electrons from the n-doped layer and excess holes from the p-doped layer are injected into the active layer by the bias voltage, where the excess electrons and holes recombine. At low current levels, the electrons recombine with the holes to produce spontaneous emission of photons in all directions. At current levels above the laser threshold value, the excess carrier density becomes high enough to produce an inverted population, yielding a positive gain. Stimulated emission occurs and a monochromatic, highly-directional beam of light is emitted from the active layer. A resonant cavity can be formed in the active layer by cleaved facets at either end of the device, one being a highly-reflective surface and the other being a partially-reflective surface through which the beam emerges. The resonant cavity can also be bounded by etched side surfaces, to prevent emission in the lateral direction, and by the cladding layers, which have indexes of refraction that are lower than the active layer to confine the light to the plane of the active layer.

The power output of a single semiconductor injection laser is rather small and is inadequate for most types of optical systems. Therefore, semiconductor injection lasers are typically combined in large two-dimensional arrays to provide increased power levels. Surface-emitting semiconductor injection lasers are particularly well suited for fabricating large two-dimensional monolithic laser arrays because of their emission of laser light from a top or bottom surface of the device. However, many surface-emitting semiconductor lasers exhibit poor thermal characteristics because of poor thermal conduction between the active layer and the heat sink. Accordingly, there has been a need for a surface-emitting semiconductor injection laser having good thermal conduction properties for operation at high power levels. The present invention is directed to this end.

SUMMARY OF THE INVENTION

The present invention resides in a surface-emitting semiconductor injection laser for use in fabricating high-power two-dimensional monolithic laser arrays. The surface-emitting semiconductor laser includes a substrate and an active layer and a pair of cladding layers formed on the substrate. A folded resonator cavity is formed by highly-reflective 45° and 90° micromirrors that are etched at either end of the active layer and by a partially-reflective reflector that is positioned between the 45° micromirror and the substrate for outcoupling the laser light from the resonator cavity. The semiconductor laser is mounted junction down on a heat sink to position the active layer close to the heat sink for good heat dissipation at high power levels. In one preferred embodiment of the present invention, the substrate is optically opaque and an opening is etched in the substrate for outcoupling the laser light. In another preferred embodiment of the invention, the substrate is optically transparent and a microlens is formed on the substrate to collimate the laser light.

It will be appreciated from the foregoing that the present invention represents a significant advance in the field of surface-emitting semiconductor injection lasers. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 1:
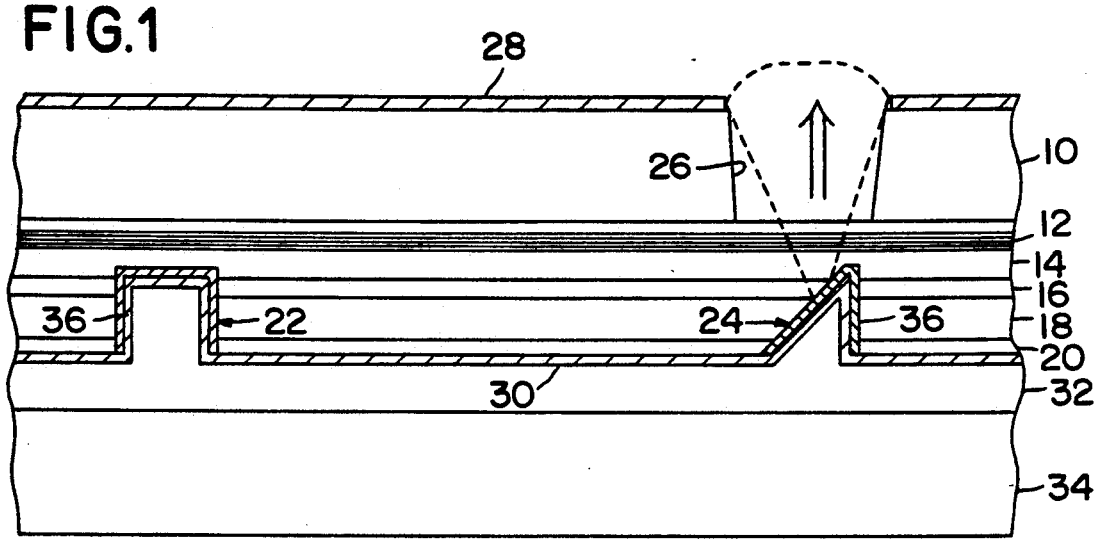
FIG. 1 is a sectional view of one preferred embodiment of the surface-emitting semiconductor injection laser of the present invention.

As shown in the drawings for purposes of illustration, the present invention is embodied in a surface-emitting semiconductor injection laser for use in fabricating high-power two-dimensional monolithic laser arrays. In accordance with the present invention, the surface-emitting semiconductor laser includes a substrate and an active layer and a pair of cladding layers formed on the substrate. A folded resonator cavity is formed by highly-reflective 45° and 90° micromirrors that are etched at either end of the active layer and by a partially-reflective reflector that is positioned between the 45° micromirror and the substrate for outcoupling the laser light from the resonator cavity. The semiconductor laser is mounted junction down on a heat sink to position the active layer close to the heat sink for good heat dissipation at high power levels. In one preferred embodiment of the present invention, the substrate is optically opaque and an opening is etched in the substrate for outcoupling the laser light. In another preferred embodiment of the invention, the substrate is optically transparent and a microlens is formed on the substrate to collimate the laser light.

As illustrated in FIG. 1, one preferred embodiment of the surface-emitting semiconductor injection laser of the present invention includes an optically opaque substrate 10, an n-doped buffer/stack reflector layer 12, an n-doped cladding layer 14, an undoped active layer 16, a p-doped cladding layer 18, and a p-doped cap layer 20. These layers 12, 14, 16, 18, 20 are grown on the substrate 10 by conventional epitaxial processes, such as molecular beam epitaxy (MBE) or metalorganic chemical vapor deposition (MOCVD). A folded resonator cavity is then formed by etching a highly-reflective 90° micromirror 22 at one end of the active layer 16 and a highly-reflective 45° micromirror 24 at the other end of the active layer 16. The 90° micromirror 22 can be etched using any conventional reactive ion etching process and the 45° micromirror 24 can be etched using any conventional ion beam etching process. An opening 26 is then etched through the optically opaque substrate 10 adjacent the 45° micromirror 24 for outcoupling the laser light from the resonator cavity. One end of the resonator cavity is formed by the 90° micromirror 22 and the other end is formed by a partially-reflective reflector, which includes the stack reflector in the buffer/stack reflector layer 12 and/or the interface between the opening 26 and the buffer layer 12. Electrical contacts 28, 30 are then deposited on the substrate 10 and cap layer 20, respectively, and the semiconductor laser is soldered, by solder layer 32, to a heat sink 34.

In this preferred embodiment of the present invention, the substrate 10 is a GaAs substrate having a thickness of approximately 100 microns. The buffer/stack reflector layer 12 includes alternating n-doped GaAs and n-doped GaAlAs layers, with the number and thickness of the layers being selected to provide a desired stack reflectivity and resonant frequency. The cladding layer 14 is an n-doped $Ga_{0.6}Al_{0.4}As$ layer having a thickness of approximately 1.5 microns and the active layer 16 is a thin undoped GaAlAs layer. The cladding layer 18 is a p-doped $Ga_{0.6}Al_{0.4}As$ layer and the cap layer 20 is a p-doped GaAs layer, with a combined thickness of approximately 1.5 microns. A half-wavelength thick film 36 of a dielectric material, such as $Si_3N_4$, is deposited on the 45° and 90° micromirrors 22, 24 for passivation and a highly-reflective coating is then deposited on the dielectric film 36. The electrical contacts 28, 30 are Ni-AuGe-Ni-Au and Ti-Pt-Au ohmic contacts, respectively. The solder layer 32 is an indium layer having a thickness of approximately 10 microns and the heat sink 34 is copper. The 45° and 90° micromirrors 22, 24 are approximately 450 microns apart and an antireflective coating is deposited in the opening 26 on the exposed buffer/stack reflector layer 12.

Figure 2:
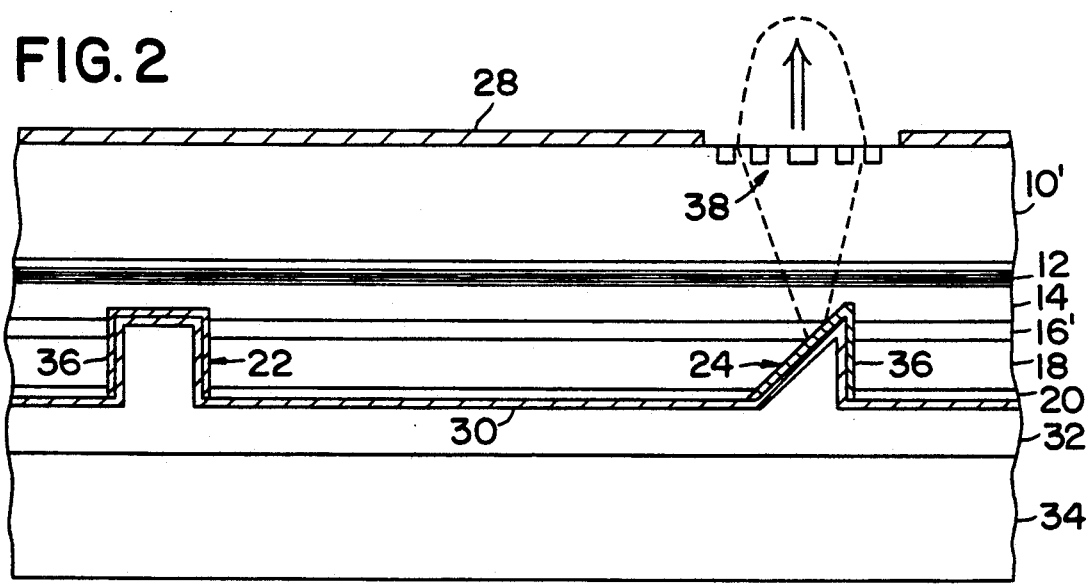
FIG. 2 is a sectional view of another preferred embodiment of the surface-emitting semiconductor injection laser of the present invention.

As illustrated in FIG. 2, another preferred embodiment of the surface-emitting semiconductor injection laser of the present invention includes an active layer 16′ that emits laser light at a longer wavelength than the absorption band edge of the GaAs substrate. This provides an optically transparent substrate 10′, which eliminates the need for the opening 26 and allows a microlens 38 to be formed on the substrate. The microlens 38 can be used to collimate the emitted beam for high intensity incoherent applications or to fill the aperture in coherent external cavity configurations.

In this preferred embodiment of the present invention, the active layer 16′ is a strained InGaAs/GaAs quantum well structure having a radiation wavelength greater than 0.9 micron, a wavelength at which the GaAs substrate 10′ is optically transparent. The substrate 10′ is a GaAs substrate having a thickness of approximately 100 microns. The buffer/stack reflector layer 12 includes alternating n-doped GaAs and n-doped GaAlAs layers which are doped with silicon to about $3\times10^{18}$ cm$^{-3}$, with the number and thickness of the layers being selected to provide a desired stack reflectivity and resonant frequency. The cladding layer 14 is an n-doped $Ga_{0.5}Al_{0.5}As$ layer having a thickness of approximately 1.0 micron, which is doped with silicon to about $5\times10^{17}$ cm$^{-3}$. The active layer 16′ includes a linearly-graded (20%-50% Al) undoped GaAlAs active layer having a thickness of 0.15 micron, a GaAs spacer layer having a thickness of 0.01 micron, an undoped InGaAs quantum well layer having a thickness of 0.005 micron, a GaAs spacer layer having a thickness of 0.01 micron, and a linearly-graded (20%-50% Al) undoped GaAlAs layer having a thickness of 0.15 micron. The cladding layer 18 is a p-doped $Ga_{0.5}Al_{0.5}As$ layer having a thickness of 1.0 micron, which is doped with zinc to about $5\times10^{17}$ cm$^{-3}$. The cap layer 20 is a p-doped GaAs layer having a thickness of 0.25 micron, which is doped with zinc to about $1\times10^{19}$ cm$^{-3}$. A half-wavelength thick film 36 of a dielectric material, such as $Si_3N_4$, is deposited on the 45° and 90° micromirrors 22, 24 for passivation and a highly-reflective coating is then deposited on the dielectric films 36. The electrical contacts 28, 30 are Ni-AuGe-Ni-Au and Ti-Pt-Au ohmic contacts, respectively. The solder layer 32 is an indium layer having a thickness of approximately 10 microns and the heat sink 34 is copper. The 45° and 90° micromirrors 22, 24 are approximately 450 microns apart and an antireflective coating is deposited on the substrate 10′.

From the foregoing, it will be appreciated that the present invention represents a significant advance in the field of surface-emitting semiconductor injection lasers. Although several preferred embodiments of the invention have been shown and described, it will be apparent that other adaptations and modifications can be made without departing from the spirit and scope of the invention. Accordingly, the invention is not to be limited, except as by the following claims.

We claim:

1. A surface-emitting semiconductor injection laser, comprising:
   a substrate;
   an active layer and a pair of cladding layers formed on the substrate; and
   a folded resonator cavity that is formed by highly-reflective 45° and 90° micromirrors etched at either end of the active layer and by a partially-reflective reflector positioned between the 45° micromirror and the substrate;
   wherein the semiconductor injection laser is mounted junction down on a heat sink for good heat dissipation and laser light is outcoupled from the resonator cavity through the partially-reflective reflector.

2. The surface-emitting semiconductor injection laser as set forth in claim 1, wherein the substrate is optically opaque and an opening is etched in the substrate to allow the laser light to be outcoupled from the resonator cavity, and wherein the partially-reflective reflector is the interface between the opening and the cladding layer.

3. The surface-emitting semiconductor injection laser as set forth in claim 2, wherein the partially-reflective reflector further includes a stack reflector positioned between the 45° mirror and the opening in the substrate.

4. The surface-emitting semiconductor injection laser as set forth in claim wherein the substrate is optically transparent to allow the laser light to be outcoupled from the resonator cavity through the substrate, and wherein the partially-reflective reflector is a stack reflector.

5. The surface-emitting semiconductor injection laser as set forth in claim 4, wherein a microlens is formed on the transparent substrate to collimate the laser light.

6. The surface-emitting semiconductor injection laser as set forth in claim 2, wherein the optically opaque substrate is a GaAs substrate, the active layer is an undoped GaAlAs layer and the cladding layers are n-doped and p-doped $Ga_{0.6}Al_{0.4}As$ layers.

7. The surface-emitting semiconductor injection laser as set forth in claim 4, wherein the optically transparent substrate is GaAs, the active layer is a strained In-GaAs/GaAs quantum well structure having a radiation wavelength greater than 0.9 micron, and the cladding layers are n-doped and p-doped $Ga_{0.5}Al_{0.5}As$ layers.

8. The surface-emitting semiconductor injection laser as set forth in claim 1, wherein the 90° micromirror is etched using a reactive ion etching process and the 45° micromirror is etched using an ion beam etching process.

9. A two-dimensional monolithic array of surface-emitting semiconductor injection lasers, each semiconductor injection laser comprising:
 a substrate;
 an active layer and a pair of cladding layers formed on the substrate; and
 a folded resonator cavity that is formed by highly-reflective 45° and 90° micromirrors etched at either end of the active layer and by a partially-reflective reflector positioned between the 45° micromirror and the substrate;
 wherein the semiconductor injection laser is mounted junction down on a heat sink for good heat dissipation and laser light is outcoupled from the resonator cavity through the partially-reflective reflector.

10. The two-dimensional monolithic array as set forth in claim 9, wherein the substrate is optically opaque and an opening is etched in the substrate to allow the laser light to be outcoupled from the resonator cavity, and wherein the partially-reflective reflector is the interface between the opening and the cladding layer.

11. The two-dimensional monolithic array as set forth in claim 10, wherein the partially-reflective reflector further includes a stack reflector positioned between the 45° mirror and the opening in the substrate.

12. The two-dimensional monolithic array as set forth in claim 9, wherein the substrate is optically transparent to allow the laser light to be outcoupled from the resonator cavity through the substrate, and wherein the partially-reflective reflector is a stack reflector.

13. The two-dimensional monolithic array as set forth in claim 12, wherein a microlens is formed on the transparent substrate to collimate the laser light.

14. The two-dimensional monolithic array as set forth in claim 10, wherein the optically opaque substrate is a GaAs substrate, the active layer is an undoped GaAlAs layer and the cladding layers are n-doped and p-doped $Ga_{0.6}Al_{0.4}As$ layers.

15. The two-dimensional monolithic array as set forth in claim 12, wherein the optically transparent substrate is GaAs, the active layer is a strained InGaAs/GaAs quantum well structure having a radiation wavelength greater than 0.9 micron, and the cladding layers are n-doped and p-doped $Ga_{0.5}Al_{0.5}As$ layers.

16. The two-dimensional monolithic array as set forth in claim 9, wherein the 90° micromirror is etched using a reactive ion etching process and the 45° micromirror is etched using an ion beam etching process.

* * * * *